United States Patent
Brollier et al.

(12)

(10) Patent No.: US 6,667,092 B1
(45) Date of Patent: Dec. 23, 2003

(54) RFID ENABLED CORRUGATED STRUCTURES

(75) Inventors: Brian W. Brollier, Cincinnati, OH (US); John Pius Soehnlen, Loveland, OH (US)

(73) Assignee: International Paper Company, Tuxedo, NY (US)

( * ) Notice: Subject to any disclaimer, the term of this patent is extended or adjusted under 35 U.S.C. 154(b) by 0 days.

(21) Appl. No.: 10/256,940

(22) Filed: Sep. 26, 2002

(51) Int. Cl.[7] .......................... B32B 3/28; B65D 85/00; G08B 13/24
(52) U.S. Cl. .................. 428/182; 428/34.2; 493/52; 340/571; 156/205; 156/250; 156/510; 206/459.1; 206/807
(58) Field of Search .................. 428/182, 184, 428/34.2; 340/571, 572.1; 206/459.1, 807; 493/52; 156/205, 250, 510

(56) References Cited

U.S. PATENT DOCUMENTS

| | | | |
|---|---|---|---|
| 3,707,711 A | 12/1972 | Cole et al. .................. 340/280 |
| 4,063,229 A | 12/1977 | Welsh et al. ................ 340/280 |
| 4,086,116 A | 4/1978 | Yazaki et al. ............... 156/205 |
| 4,311,746 A | 1/1982 | Chavannes ................. 428/110 |
| 4,369,082 A | 1/1983 | Kerwin ...................... 156/238 |
| 5,103,235 A | 4/1992 | Clemens .................... 343/742 |
| 5,406,263 A | 4/1995 | Tuttle ......................... 340/572 |
| 5,448,110 A | 9/1995 | Tuttle et al. ................ 257/723 |
| 5,486,405 A | * 1/1996 | Laves ......................... 428/182 |
| 5,497,140 A | 3/1996 | Tuttle ........................... 342/51 |
| 5,528,222 A | 6/1996 | Moskowitz et al. ........ 340/572 |
| 5,566,441 A | 10/1996 | Marsh et al. ................. 29/600 |
| 5,637,377 A | * 6/1997 | Vermillion .................. 428/182 |
| 5,646,592 A | 7/1997 | Tuttle ......................... 340/572 |
| 5,821,859 A | 10/1998 | Schrott et al. .............. 340/572 |
| 5,831,531 A | 11/1998 | Tuttle ......................... 340/572 |
| 5,871,100 A | 2/1999 | Ward ........................... 206/705 |
| 5,884,425 A | 3/1999 | Baldwin ....................... 40/638 |
| 5,908,135 A | 6/1999 | Bradford et al. ............ 220/673 |
| 5,909,176 A | 6/1999 | Schrott et al. ........... 340/572.1 |
| 5,982,284 A | 11/1999 | Baldwin et al. ......... 340/572.8 |
| 6,013,949 A | 1/2000 | Tuttle ......................... 257/723 |
| 6,019,865 A | 2/2000 | Palmer et al. .............. 156/265 |
| 6,025,780 A | 2/2000 | Bowers et al. ........... 340/572.3 |
| 6,027,027 A | 2/2000 | Smithgall .................... 235/488 |
| 6,028,518 A | 2/2000 | Rankin et al. ........... 340/572.1 |
| 6,091,332 A | 7/2000 | Eberhardt et al. ....... 340/572.1 |
| 6,114,962 A | 9/2000 | Wiklof et al. ............ 340/572.8 |
| 6,130,613 A | 10/2000 | Eberhardt et al. ....... 340/572.7 |
| 6,206,292 B1 | 3/2001 | Robertz et al. ............. 235/488 |
| 6,246,327 B1 | 6/2001 | Eberhardt ................ 340/572.1 |
| 6,259,369 B1 | 7/2001 | Monico ................... 340/572.8 |
| 6,278,379 B1 | 8/2001 | Allen et al. ............. 340/870.16 |
| 6,281,795 B1 | 8/2001 | Smith et al. ............. 340/572.1 |
| 2001/0010853 A1 | 8/2001 | Schragle ...................... 428/68 |
| 2002/0044096 A1 | 4/2002 | Chung ........................ 343/742 |

* cited by examiner

Primary Examiner—Donald J. Loney

(57) ABSTRACT

A corrugated structure has a first and a second linerboard, with a corrugated medium sandwiched between the first and second linerboards. An RF processor is coupled between one of the linerboards and the corrugated medium. The processor may be positioned on an inlet or label, which may also include an antenna. A method of forming a corrugated structure having an embedded RFID processor includes providing a linerboard and a corrugated medium, positioning an RF processor between the linerboard and the corrugated medium, and affixing the linerboard and corrugated medium together with the RF processor positioned therebetween. An assembly line for forming a corrugated structure includes a supply of a first linerboard, a second linerboard, a corrugating material stock, and inlets that have an RF processor and antenna coupled to the inlets. The assembly line also includes a corrugator, a single facer, a double facer, an inlet applicator, and a cutter. The inlet applicator is for coupling the inlets to the corrugated medium.

58 Claims, 5 Drawing Sheets

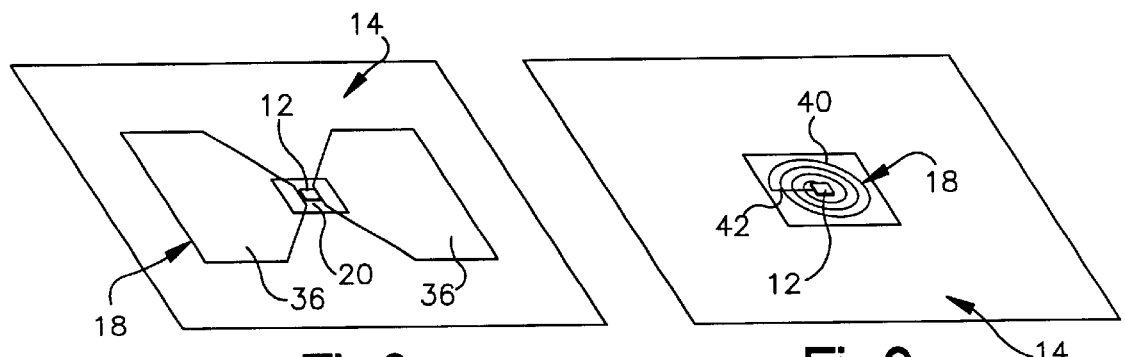
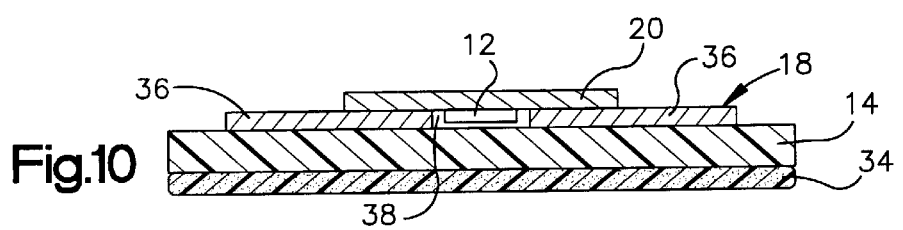
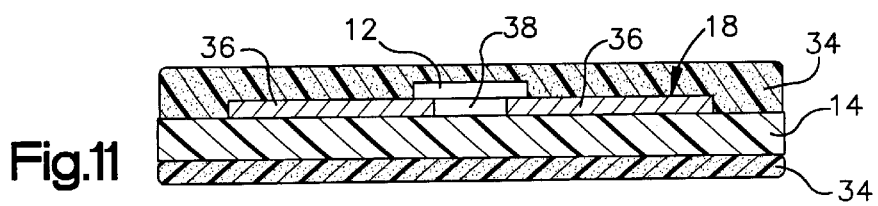
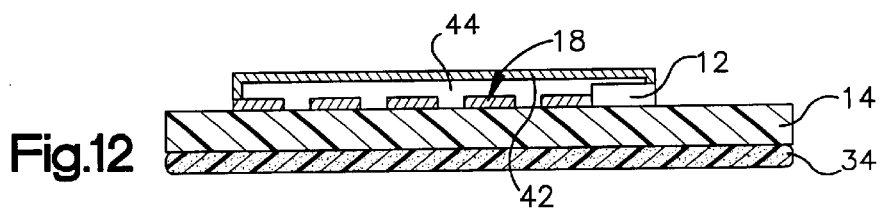
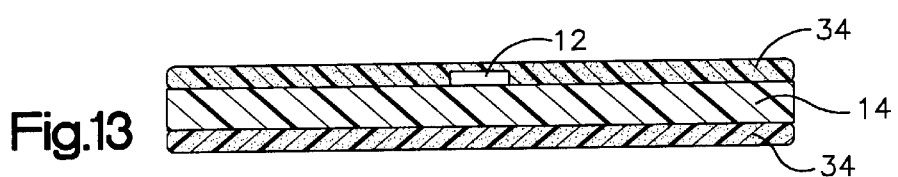
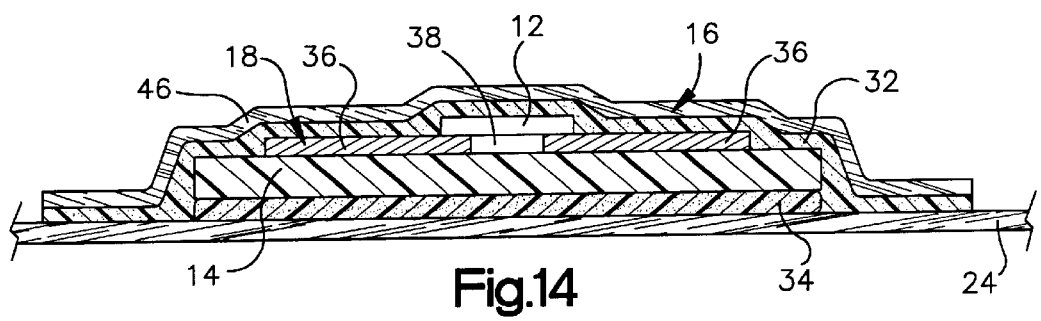

RFID ENABLED CORRUGATED STRUCTURES

FIELD OF THE INVENTION

The invention relates to wireless communication systems. In particular, the invention relates to corrugated structures that incorporate RFID components.

BACKGROUND

Radio frequency identification (RFID) technology has been used for wireless automatic identification. An RFID system typically includes a transponder, an antenna, and a transceiver with a decoder. The transponder, which typically includes a radio frequency integrated circuit, and antenna may be positioned on a substrate, such as an inlet or tag. The antenna serves as a pipeline between the circuit and the transceiver. Data transfer between the transponder and transceiver is wireless. RFID systems may provide non-contact, non-line of sight communication.

RF transponder "readers" utilize an antenna as well as a transceiver and decoder. When a transponder passes through an electromagnetic zone of a reader, the transponder is activated by the signal from the antenna. The transceiver decodes the data on the transponder and this decoded information is forwarded to a host computer for processing. Readers or interrogators can be fixed or handheld devices, depending on the particular application.

Several different types of transponders are utilized in RFID systems, including passive, semi-passive, and active transponders. Each type of transponder may be read only or read/write capable. Passive transponders obtain operating power from the radio frequency signal of the reader that interrogates the transponder. Semi-passive and active transponders are powered by a battery, which generally results in a greater read range. Semi-passive transponders may operate on a timer and periodically transmit information to the reader. Transponders may also be activated when they are read or interrogated by a reader. Transponders may control their output, which allows them to activate or deactivate apparatus remotely. Active transponders can initiate communication, whereas passive and semi-passive transponders are activated only when they are read by another device first. Active transponders can supply instructions to a machine and then the machine may then report its performance to the transponder. Multiple transponders may be located in a radio frequency field and read individually or simultaneously. Sensors may be coupled to the transponders to sense an environmental condition.

SUMMARY

According to the invention, a corrugated structure comprises a linerboard, a corrugated medium coupled to the linerboard, and an RF processor coupled between the linerboard and the corrugated medium. The linerboard may comprise a first and a second linerboard, and the corrugated medium is coupled between the first and second linerboard. An adhesive may be positioned between the first and second linerboards and the corrugated medium. In a preferred embodiment, the RF processor is positioned between the second linerboard and the corrugated medium.

In another embodiment of the invention, a method of forming a corrugated container with RFID components comprises providing the corrugated structure discussed above, cutting the corrugated structure into a blank, scoring the corrugated structure to produce fold lines, and assembling the blank into the shape of a container.

In yet another embodiment, a method of forming a corrugated structure having an embedded RFID processor comprises providing a linerboard, providing a corrugated medium, positioning an RF processor between the linerboard and the corrugated medium, and affixing the linerboard and the corrugated medium together with the RF processor positioned between the linerboard and the corrugated medium to form a corrugated structure.

In an alternative embodiment, an assembly line for forming a corrugated structure comprises a supply of a first linerboard, a supply of a second linerboard, a supply of a corrugating material stock, and a supply of inlets comprising an RF processor and an antenna coupled to the processor. The assembly line also includes a corrugator, a single facer, a double facer, an inlet applicator, and a cutter. The corrugator is for corrugating the corrugating material stock into a corrugated medium. The single facer is for joining the first linerboard to the corrugated medium. The double facer is for joining the second linerboard to the corrugated medium on a side of the corrugated medium opposite the first linerboard to form a corrugated structure. The inlet applicator is for coupling the supply of inlets to one of the first linerboard or the second linerboard. The inlet applicator is positioned upstream of the double facer and the cutter is for cutting the corrugated structure into blanks.

In yet another embodiment, the assembly line for forming a corrugated structure comprises a supply of a first linerboard, a supply of a second linerboard, a supply of a corrugating material stock, and a supply of inlets comprising an RF processor. The second linerboard has an antenna positioned on its surface in a regular pattern. The assembly line also includes a corrugator for corrugating the corrugating material stock into a corrugated medium. The corrugator is positioned downstream from the supply of corrugating material stock. The assembly line also includes a single facer, a double facer, an inlet applicator, and a cutter. The single facer is for joining the first linerboard to the corrugated medium. The double facer is for joining the second linerboard to the corrugated medium on a side of the corrugated medium opposite the first linerboard. The inlet applicator is for positioning the inlet on the second linerboard in electrical communication with the antenna. The inlet applicator is preferably positioned upstream of the double facer. The cutter is for cutting the corrugated structure into blanks.

BRIEF DESCRIPTION OF THE DRAWING FIGURES

FIG. 8 is a top perspective view of an RF inlet utilizing a capacitive antenna system;

FIG. 9 is a top perspective view of an RF inlet utilizing an inductive antenna system;

FIG. 10 is a cross-sectional view of the RF inlet depicted in FIG. 8;

FIG. 11 is a cross-sectional view of an alternative embodiment of an RF inlet similar to that shown in FIG. 8;

FIG. 12 is a cross-sectional view of an RF inlet similar to that shown in FIG. 9;

FIG. 13 is a cross-sectional view of yet another embodiment of the RF inlet;

FIG. 14 is a cross-sectional view of an alternative embodiment of an RF inlet positioned on a label;

DETAILED DESCRIPTION

Figure 1:
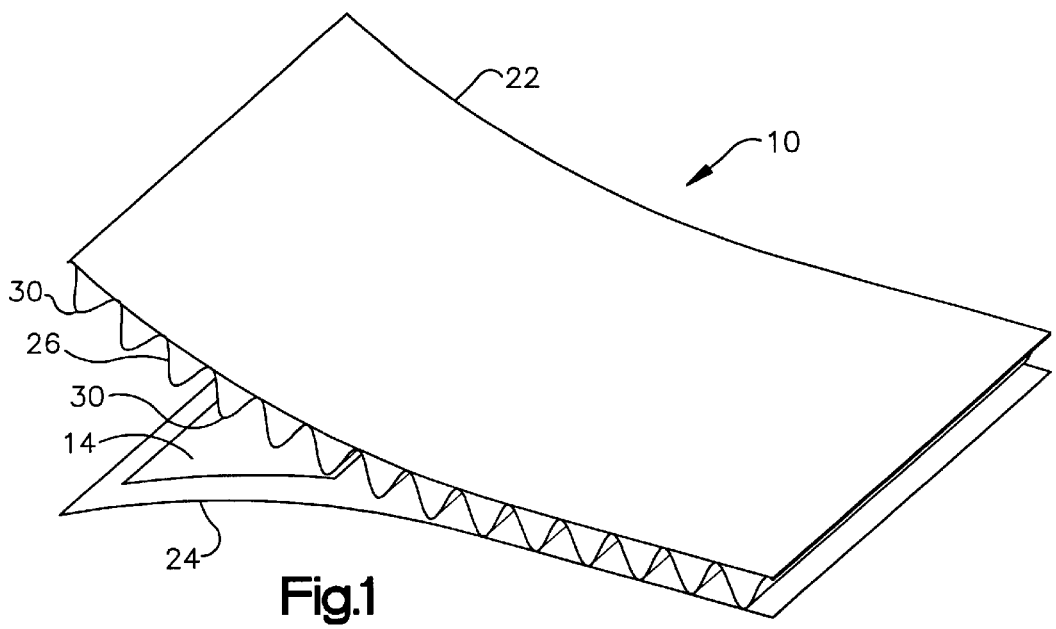
FIG. 1 is a perspective view of a corrugated structure according to the invention showing an RFID inlet positioned within the structure.

A corrugated structure 10 having an embedded radio frequency identification (RFID) processor 12 is shown in FIGS. 1–16. The RFID processor 12 is embedded within the body of the corrugated structure 10. The corrugated structure 10 may then be formed into a container or other vessel so that the RFID components are covert in nature and, thus, not easily identified by a user. Because the processor 12 is covert in nature, it is not easily removed from the corrugated structure 10. The RFID processor 12, when embedded in the corrugated structure, may be energized by a reader to provide a radio frequency signal that may be used in inventory tracking or identification, among other known uses for RFID. The corrugated structure 10 also helps to protect the processor 12 from damage from external forces that are applied to the container during transport.

The present design uses a corrugated structure 10 produced from a known assembly process and embeds an RF processor 12 within the structure 10 during the assembly process. The processor 12 may be positioned in a number of different configurations within the corrugated structure 10. For example, the processor 12 may have an onboard antenna and be positioned unaccompanied within the corrugated structure 10, or may be positioned on an inlet 14 or label 16 that is positioned within the corrugated structure 10. Alternatively, the processor 12 may be coupled to an antenna 18 that is positioned directly on the inlet 14 or label 16, or that is positioned on another part of the corrugated structure 10 so that the processor 12 electrically couples to the antenna 18. In all instances, the processor 12 will be covert, because it is positioned inside the corrugated structure 10. Examples of several embodiments will be discussed in greater detail below.

The term "processor" 12 as used herein refers generally to a computer that processes or stores information, such as a computer chip. The processor 12 may include a semiconductor circuit having logic, memory, and RF circuitry. The processor may include a computer chip that is coupled to an interposer 20, that utilizes leads to attach the computer chip to conductive materials, or that utilizes terminals that exist on the chip surface to electrically couple to conductive materials. The computer chip may be a silicon-based chip, a polymer-based chip, or other chips that are known today or will be developed in the future. In addition, the term "processor" 12 includes new "chipless" technology, such as that manufactured by Checkpoint; "flip chips" that include bridging connections built directly into the chip; or other chips that include substrates that act like interposers 20. Thus, the term "processor" 12 as used herein encompasses a variety of embodiments and configurations.

Referring to the figures, FIG. 1 depicts a corrugated structure 10 having a first linerboard 22, a second linerboard 24, and a corrugated medium 26 sandwiched between the first and second linerboards 22, 24. The corrugated medium 26 is attached to the first and second linerboards 22, 24 by an adhesive 28, which is generally applied to the tips 30 of the individual flutes of the corrugated medium 26. Alternatively, an adhesive 28 may be applied to the linerboards 22, 24, which are then attached to the corrugated medium 26.

An inlet 14 is positioned between the second linerboard 24 and the corrugated medium 26. An inlet 14 is typically a substrate that carries the processor 12 and antenna 18. The substrate may be polyester, PET, paper, ABS, PVC, and other polymeric and non-polymeric materials. The processor 12 and antenna 18 may be positioned on a single substrate, or may be sandwiched between two substrates of like or non-like materials. In addition, an inlet 14 may be attached to a backing paper 46 by an adhesive 34 in order to create a label 16. An adhesive layer 32 will typically be applied to one or both external sides of the backing paper 46. Once the inlet 14 is attached to the backing paper 46 to form a label 16, the label 16 may be applied to the corrugated structure surfaces. Alternatively, adhesive 34 may be directly applied to the inlet 14, without the need for a paper backing 46.

The inlet 14 may be slid between the linerboard 24 and corrugated medium 26 so that the adhesive 28 utilized to adhere the corrugated medium 26 to the linerboard 22, 24 assists in adhering the inlet 14 in position. Alternatively, the inlet 14 or label 16 and may be adhered directly to the linerboard 22, 24 and/or the corrugated medium 26. The inlet or label may be applied to the linerboard 22, 24 or corrugated medium 26 by an applicator. In a preferred embodiment, the inlet 14 and label 16 are flexible, so that they may withstand the bending forces that are applied during the assembly process of the corrugated structure 10.

The processor 12 positioned on the inlet 14 or label 16 may include an onboard antenna, in which case an additional external antenna 18 is not normally necessary. However, onboard antennas often have short read ranges. Therefore, it may be necessary to position a reader in close proximity to the processor 12 in order to obtain a reading of the information stored in the processor 12 when an onboard antenna is utilized. An external antenna 18 may be preferable to an onboard antenna because an external antenna 18 is likely to have a longer read range. The external antenna 18 may take on numerous shapes and sizes, which are designed to optimize the read range of the processor 12 and antenna 18.

An external antenna 18 may be positioned on the same inlet 14 or label 16 that the processor 12 is positioned on, or may be separate from the inlet 14 or label 16. For example, the antenna 18 may be positioned on one of the corrugated structure surfaces, such as the linerboards 22, 24 or corrugated medium 26. Alternatively, the antenna 18 may be positioned on its own inlet 14 or label 16. In either case, the processor 12 is electrically coupled to the antenna 18. The processor 12 may be coupled by positioning the terminals of the processor 12 in proximity to the antenna 18. This includes positioning the processor 12 on top of or under the poles of the antenna 18, utilizing leads or other connectors to connect the terminals of the processor 12 with the antenna 18, or capacitively coupling the terminals of the processor 12 to the antenna 18.

Figure 2:
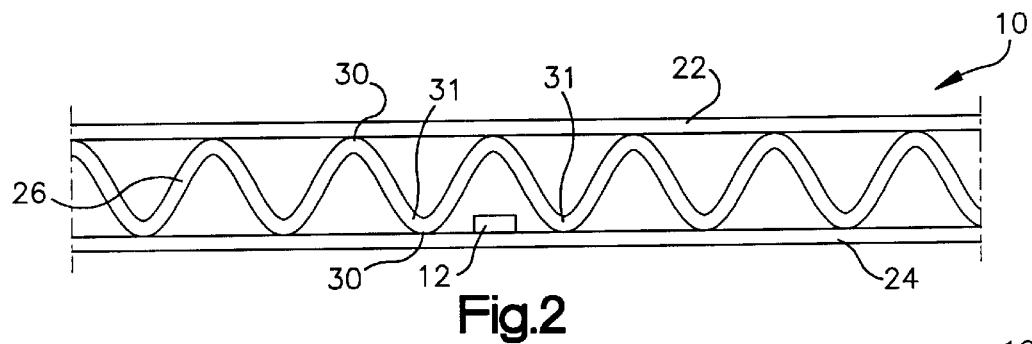
FIG. 2 is a partial cross-sectional view of a corrugated structure depicting an RF processor positioned within the structure.

FIG. 2 depicts a corrugated structure 10 where a processor 12 is positioned between the flutes of the corrugated medium 26. In this embodiment, an inlet 14 is not utilized and the processor 12 includes an onboard antenna. The processor 12 is attached to the second linerboard 24 by an adhering medium 28, such as an adhesive. It is preferable that the processor 12 be positioned between the flutes 31 of the corrugated medium 26, since the flutes provide protection for the processor 12 both during the joining process and after the corrugated structure 10 has been formed.

Figure 3:
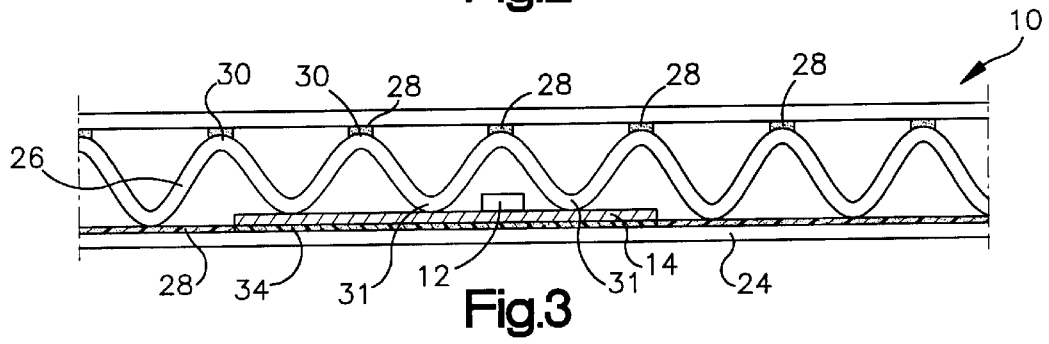
FIG. 3 is a partial cross-sectional view of another embodiment of the corrugated structure depicting an RF processor coupled to an inlet and positioned within the structure.

FIG. 3 depicts a corrugated structure 10 where the processor 12 is positioned on an inlet 14, and the inlet 14 includes a layer of adhesive 34 that is utilized to join the inlet 14 to the second liner board 24. The processor 12 includes an onboard antenna and is positioned between the flutes 31 of the corrugated medium 26. In this embodiment, an adhesive 28 is applied to the flutes 31 of the corrugated structure 10 adjacent the first linerboard 22 for joining the first linerboard 22 to the corrugated medium 26. A layer of adhesive 28 is shown applied to the second linerboard 24 to join the second linerboard 24 to the corrugated medium 26. The adhesive may be applied to either the flutes 31 of the corrugated medium 26 or to the linerboard 22, 24, although application to the flutes 31 is more common. While the adhesive for joining the linerboards 22, 24 and corrugated medium 26 is not shown in the remaining figures, an adhesive or other adhering medium is typically utilized to join the linerboard 22, 24 to the corrugated medium 26.

Figure 4:
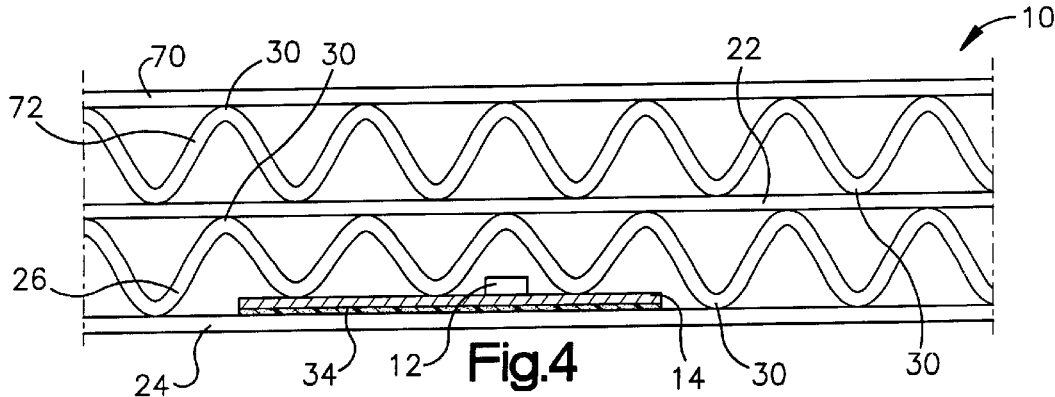
FIG. 4 is a partial cross-sectional view of an alternative embodiment of the corrugated structure depicting an RF processor coupled to an inlet and positioned within the structure.

FIG. 4 shows an alternative embodiment of the corrugated structure 10 having a multiwall construction where a second corrugated medium 72 and a third linerboard 20 are utilized with the previously depicted first and second linerboards 22, 24 and corrugated medium 26. In this embodiment, an inlet 14, similar to that of FIG. 3, is positioned between the second linerboard 24 and corrugated medium 26, with the processor 12 of the inlet 14 positioned between the flutes 31. The inlet 14 is adhered to the second linerboard 24 utilizing an adhesive layer 34, which may be applied to the inlet 14 or directly to the linerboard 24. The second corrugated medium is adhered to the first linerboard 22 and the third linerboard 70 is adhered to the free side of the second corrugated medium 72. A multiwall corrugated structure, such as that in FIG. 4, may include additional corrugated medium layers and linerboards. The RF processor can be positioned between any of the layers, the invention not being limited to the position shown in FIG. 4.

Figure 5:
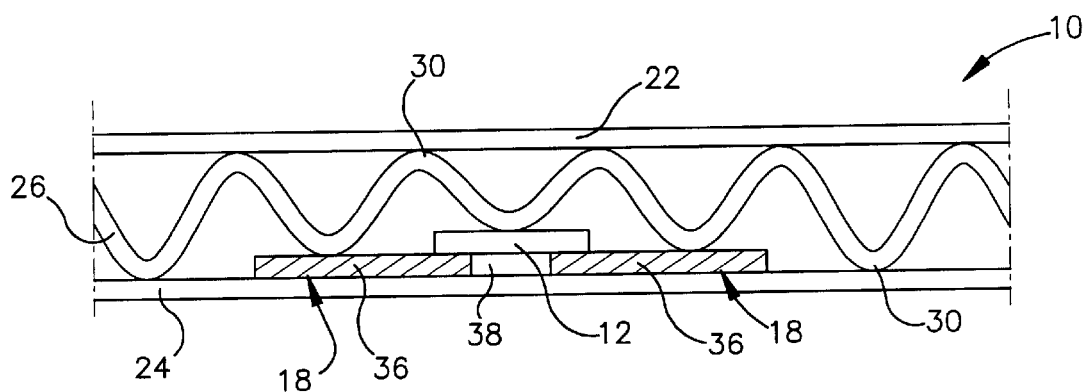
FIG. 5 is a partial cross-sectional view of yet another embodiment of the corrugated structure showing an antenna and RF processor positioned within the structure.
Figure 6:
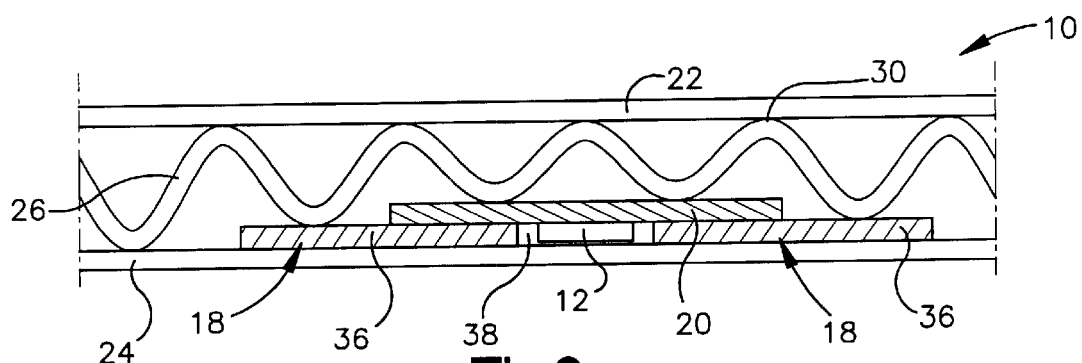
FIG. 6 is a partial cross-sectional view of an alternative embodiment similar to FIG. 5, but including an interposer positioned within the structure.
Figure 7:
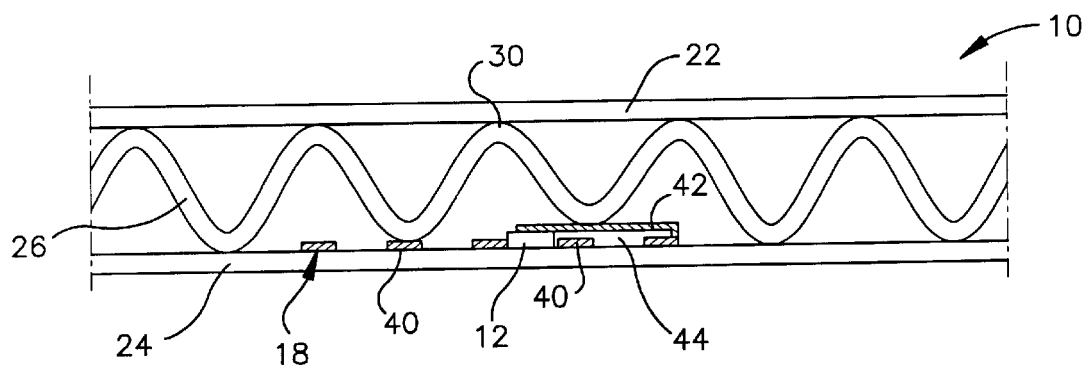
FIG. 7 is a partial cross-sectional view of another embodiment of the corrugated structure showing an antenna and processor positioned within the structure.

FIGS. 5–7 show several different antenna 18 and processor 12 configurations, where the antenna 18 is positioned directly on the surface of the linerboard 22, 24, rather than on an inlet 14 or label 16. FIGS. 5 and 6 show a capacitive antenna system and FIG. 7 shows an inductive antenna system.

Referring to FIGS. 5 and 6, a typical capacitive antenna 18 will utilize two areas or pads 36 of conductive material with a gap 38 positioned between the conductive pads 36. The processor 12 is positioned within the gap 38 and is electrically coupled to the conductive pads 36. FIG. 5 depicts a corrugated structure 10 where a capacitive antenna is positioned on the second linerboard 24 and a capacitive processor 12 is electrically coupled to the antenna. The capacitive processor 12 has two terminals and the capacitive antenna includes two conductive pads 36 separated by a gap 38. The processor 12 is positioned over the gap 38 so that one terminal of the processor couples to one conductive pad and the other terminal of the processor couples to the other conductive pad. FIG. 6 is similar to FIG. 5, but utilizes an interposer 20 coupled between the processor 12 and conductive pads 36. The interposer 20 serves as the conduit for establishing an electrical connection between the poles of the pads 36 and the terminals of the processor 12. If desired, an inlet 14 or label 16 may be utilized to position the processor 12 and antenna 18 on the linerboard 22, 24, instead of applying the components directly to the linerboard 22, 24.

FIG. 7 shows an inductive antenna system, where a processor 12 and a spiral antenna 40 having individual loops is positioned on the second linerboard surface. The processor 12 is shown positioned inside the spiral antenna 40. The spiral antenna 40 has two ends or poles, with a first pole directly connected to one of the terminals of the processor 12, and a second pole connected to the other terminal by a bridging connector 42. The antenna 40 and processor 12 may alternatively be applied to an inlet 14 or label 16, which may be positioned between the second linerboard 24 and corrugated medium 26, as previously discussed. Other types of inductive antennas may also be utilized, as known by those of skill in the art.

FIGS. 8–12 depict several embodiments of the inlet 14 and label 16 of the present design. The inlet 14 or label 16 may be positioned between the linerboard 22, 24 and corrugated medium 26 of the corrugated structure 10, as previously discussed. FIGS. 8, 10 and 11 show a capacitive antenna utilizing two conductive pads 36 with a gap 38 positioned between the pads 36. A processor 12 is positioned in the gap 38, and is electrically coupled to the conductive pads 36. In FIGS. 8 and 10, an interposer 20 is positioned between the terminals of the processor 12 and the conductive pads 36. As previously discussed, the interposer 20 serves as the conduit for establishing an electrical connection between the processor 12 and antenna 18.

FIGS. 9 and 12 show an inductive antenna, where the antenna 18 is a spiral loop antenna 40 that is positioned on the inlet surface. In FIG. 9, the processor 12 is positioned in the center of the loop (as shown in cross-section in FIG. 7). In FIG. 12, the processor 12 is positioned outside of the loop 40. A bridging connector 42 is utilized to connect the outer pole of the antenna 40 to the terminal of the processor 12. The inner pole is directly connected to the other terminal of the processor 12. An insulating dielectric 44, such as a plastic or nonconductive adhesive, may be positioned between the bridging connector 42 and the antenna loops 40.

An antenna 18 may be applied to the linerboards 22, 24, corrugated medium 26, or inlet 14 or label 16 by any number of application techniques. With either type of antenna system, the antenna 18 may be formed by depositing metal or other conductive materials, such as by sputter coating, hot foil stamping, or printing a conductive material, such as a polymer or ink, on the substrate. Alternatively, the antenna 18 may be formed by adhesively attaching a preformed antenna 18, or by attaching a preformed antenna 18 on an inlet 14 or label 16. The antenna 18 may be shaped as solid areas of conductive material such as pads 36, or may be formed in more defined shapes, such as a spiral, a coil, a loop, or an arm. In forming varied shapes, a conductive area may be formed and the antenna shape may be cut into the conductive area using etching, laser ablation, or mechanical or chemical removal. In addition, a shaped antenna 18 may be formed by masking off parts of the substrate, depositing a conductive material, and then removing the masking, the invention not being limited to a particular method of forming the antenna 18, or to a particular antenna shape.

Referring to FIG. 13, as previously discussed, the inlet 14 may be applied to the corrugated medium 26 or linerboards 22, 24 by first applying an adhesive 28 to the corrugated medium 26 or linerboards 22, 24 and then applying the inlet 14 onto the adhesive 28. The inlet 14 may also include an adhesive layer 34, as shown in FIG. 13. An adhesive layer 34 may be positioned on either or both the bottom and top of the inlet 14. The adhesive may be any type of adhesive. The adhesive utilized on the label 16 and inlet 14 may be activated during application of the inlet 14 or label 16 to the corrugated structure 10, such as by water, heat, or pressure.

FIG. 14 shows an alternative embodiment of the inlet 14 where a backing paper or other substrate 46 is attached to the inlet 14 to form a label 16. The backing paper 46 is preferably positioned over the processor on the inlet so that the adhesive 32 layer on the backing paper adheres to the inlet. The inlet 14 may also include an adhesive layer 34 that mates with the adhesive layer 32 on the backing paper 46 to adhere the inlet 14 to the backing paper 46. The backing paper 46 is preferably larger than the inlet 14 so that a portion of the backing paper 46 extends past the outer edges of the inlet to create a label 16. The layer of adhesive 32 on the backing paper 46 also preferably extends past the edges of the inlet 14 so that the label 16 may be attached to a surface. The inlet 14 also is shown as including an adhesive layer 34 so that the adhesive 34 of the inlet 14 and the adhesive 32 of the label 16 work in concert to adhere the label to a substrate. A paper label 16 may be preferred with certain types of adhesive, such as starch-based glues, rather than a plastic inlet layer so that the label may be more easily adhered to the flutes of the corrugated medium 26. A capacitive antenna and processor 12 are shown (for illustration purposes) positioned on top of the inlet 14 in FIG. 14.

The corrugated structure described in the various embodiments above may also include an additional sheet (not shown) that is laminated or otherwise adhered to one or more of the linerboards 20, 22, 24. The additional sheet can be used for applying a printed surface, such as an exterior, to the corrugated structure, for extra thickness or toughness, or for otherwise altering the appearance of the corrugated structure, among other uses. One type of additional sheet is known as a Litholam, which is a lithographically printed sheet that is laminated to one of the linerboards of the corrugated structure. The Litholam sheet is preprinted and then adhered to one of more of the linerboards of the corrugated structure. The Litholam is used to provide a high quality printed surface to the corrugated structure, since it is oftentimes difficult to obtain high quality printed corrugated structures by directly printing on the corrugated structure itself. The Litholams can be of various colors and include any variety of printing.

Figure 15:
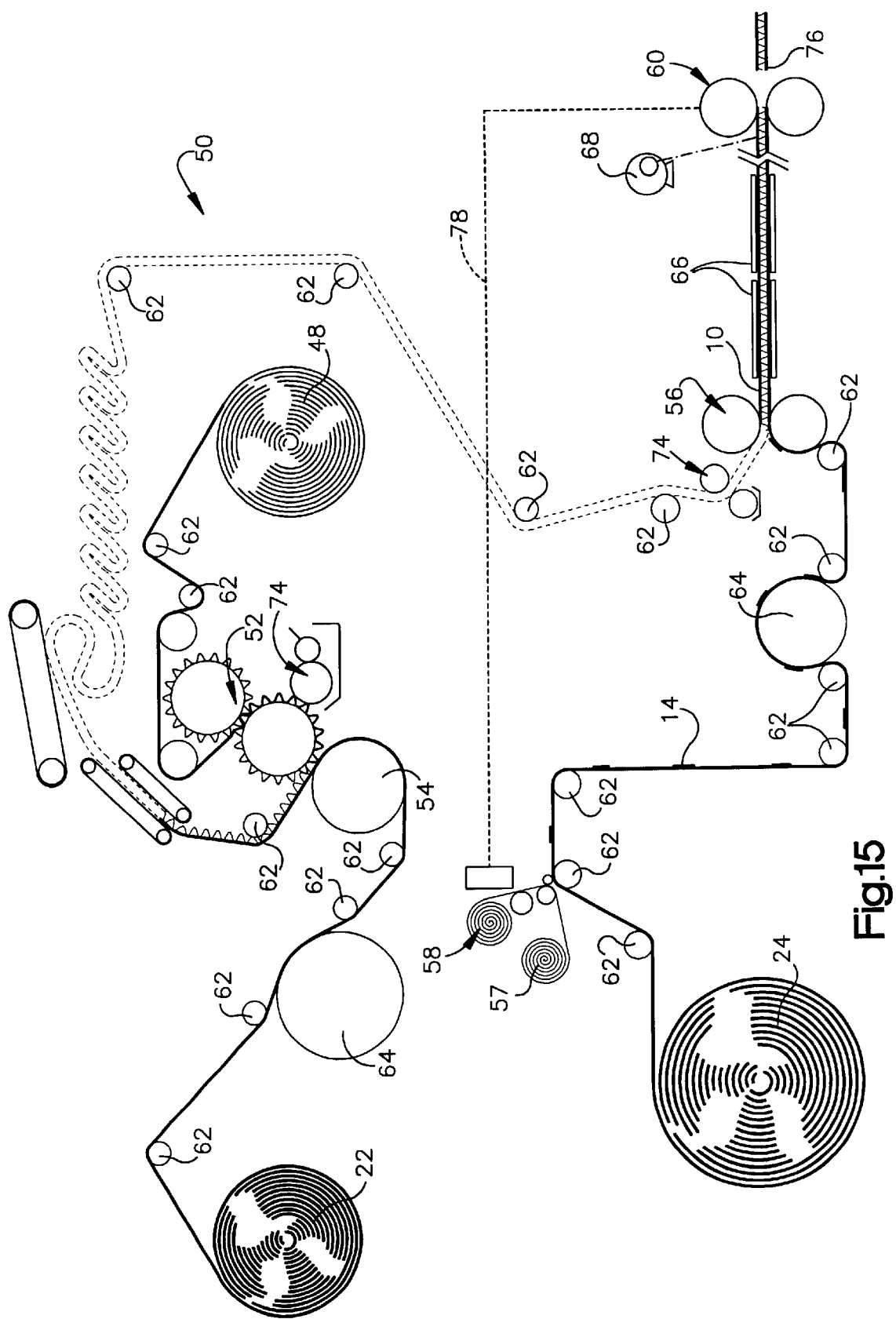
FIG. 15 is a schematic of an assembly line according to the claimed invention.
Figure 16:
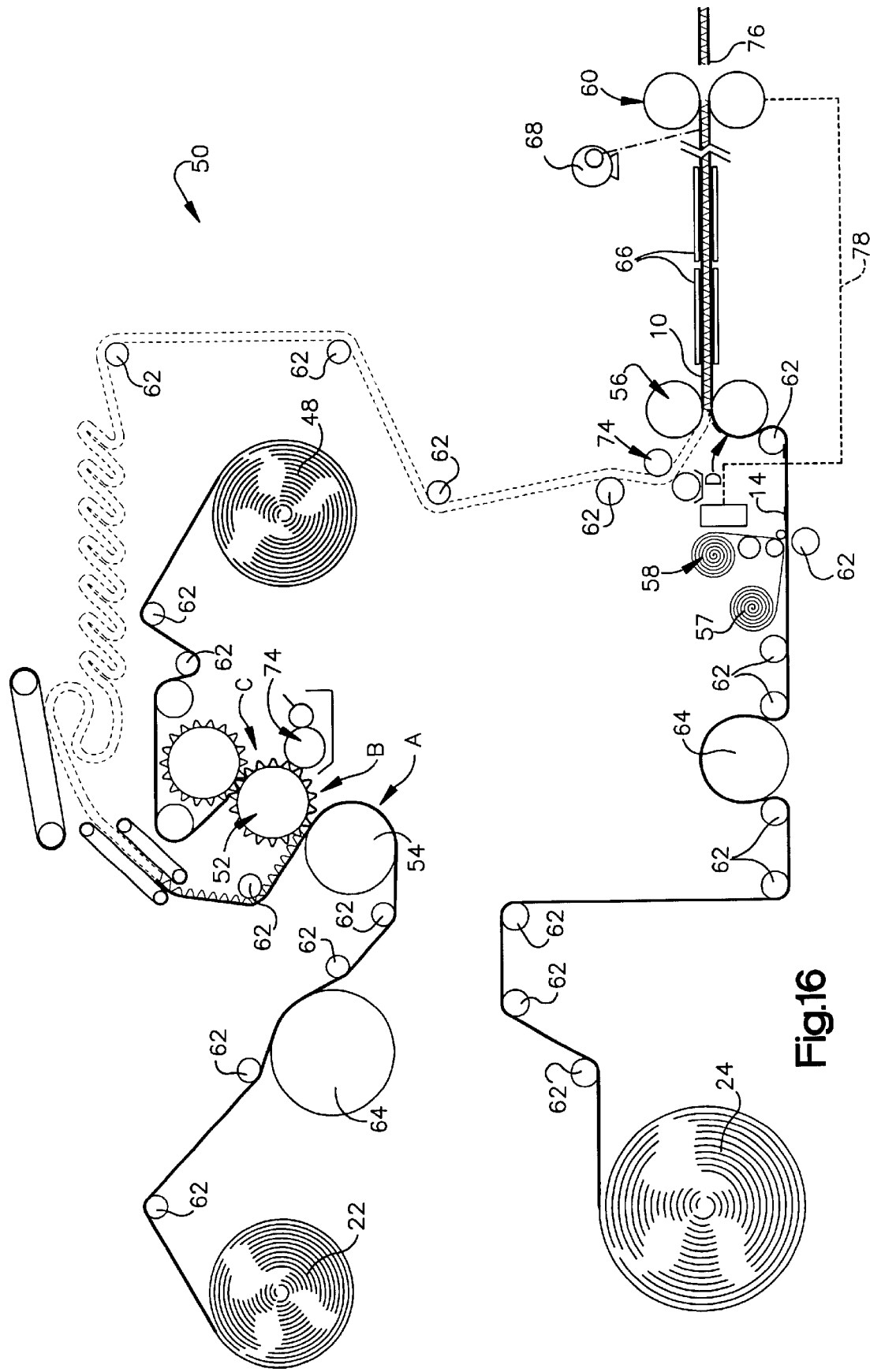
FIG. 16 is a schematic of an alternative embodiment of an assembly line.

FIGS. 15 and 16 depict an assembly line 50 for manufacturing a corrugated structure 10 that includes RFID components. The assembly line 50 preferably includes a supply of a first linerboard 22, a supply of a second liner board 24, a supply of a corrugating material stock 48, and a supply 57 of inlets 14, labels 16, or processors 12. For ease of explanation in the description that follows, these inlets, labels, and processors will collectively be referred to as inlets for the assembly line description. The inlets 14 may include solely a processor 12, or a processor 12 and antenna 18. When the inlet 14 includes only a processor 12, the processor 12 may include an onboard antenna, or a separate antenna 18 may be positioned on either the corrugated medium 26 or the second linerboard 24. The inlets 14 may be supplied in a roll 57, in a fan fold, or already cut into single pieces. The assembly line 50 also includes a corrugator 52, a single facer 54, a double facer 56, an inlet applicator 58, and a cutter 60. Numerous idler rollers 62 are also provided.

In the assembly process, the corrugating material stock 48 is fed into the corrugator 52, which corrugates the corrugating material stock 48 into a corrugated medium 26. The corrugator 52 is positioned downstream from the supply of corrugating material stock 48. An adhesive 28 is applied to the flutes 31 of the corrugated medium 26 by an adhesive applicator 74 after the corrugating material stock 48 is corrugated. The first linerboard travel through a preheater 64 and the corrugated medium 26 is then joined to the first linerboard 22 by a single facer 54. The second linerboard 24 is fed through a preheater 64, and is then joined to the corrugated medium 26 and first linerboard 22 at the double facer 56. Prior to entering the double facer 56, an adhesive 28 is applied to the flutes of the corrugated medium 26 by another adhesive applicator 74. This adhesive 28 joins the second linerboard 24 to the corrugated medium 26 in the double facer 56. The corrugated structure 10 is then fed into a dryer 66, which dries the adhesive 28 and forms the final corrugated structure 10. The corrugated structure 10 is then cut by a cutter 60 to form a plurality of blanks 76.

The RF components may be inserted into the corrugated structure 10 along the assembly process at any number of positions and by any number of ways, as previously discussed. An inlet applicator 58 is used to insert an inlet 14 into the structure 10. In FIG. 15, the applicator 58 applies the inlet 14 upstream from the preheater 64. In this embodiment, the RF processor 12 is preferably capable of withstanding the heat of the preheater 64. In FIG. 16, the applicator 58 is shown positioned downstream from the preheater 64, but upstream from the double facer 56. FIG. 16 also shows several other locations where the inlets 14 may be applied to the corrugated structure, labeled by arrows A, B, C, and D. Arrow A shows a position for the inlet applicator on the single facer 54 before the corrugated medium is joined to the first linerboard. Arrows B and C show a position for the inlet applicator that is downstream from the corrugator, but upstream from the single facer. In this embodiment, the processor 12 is preferably positioned between the flutes 31 of the corrugated medium 26, in order to avoid crushing the processor between the teeth of one of the single facer rolls. Arrow D shows the inlet applicator positioned on the double facer upstream of where the double facer joins the corrugated medium and first linerboard to the second linerboard. In an alternative embodiment, which is not shown, the inlet 14 may be slid between the rollers of the double facer 56. As discussed above, the inlet 14 may include an adhesive layer 34, if desired.

The assembly line 50 also includes a registration mechanism 68 for registering the corrugated structure 10 so that a single RF processor 12 is positioned on each blank 76. For instance, a sensor, such as an electric eye, may be utilized with a preprinted mark on one of the linerboards 22, 24. The sensor senses the preprinted mark and sends a signal to the cutter 60 to cut a blank 76. The signal can also be sent to the applicator 58 along a control loop 78, which can signal the applicator 58 to apply an inlet 14 to the structure 10 at an instructed time. Other registration techniques may also be utilized, such as one in which the cutter 60 is signaled to cut based upon a length of the blank 76. The applicator movement may be triggered by the knife movement. More than one sensor may also be utilized. A computer (not shown) may also be utilized along the control loop 78.

In addition, the processor 12 itself may be utilized in registering the moving web of corrugated structure 10. A reader may determine the position of the processor 12 on the web. Based upon the sensed position of the processor 12, an operating system will instruct the cutter 60 to cut at a given time, and the applicator 58 to apply an inlet 14 at a given time. Other registration techniques may also be utilized as known by those of skill in the art of registering to a moving web.

While not shown, a recess may be formed in the substrate on which the processor 12 and antenna 18 are positioned. For instance, when the processor 12 and antenna 18 are positioned on one of the linerboards 22, 24, the linerboard 22, 24 may be embossed so that a recess is formed for positioning the processor 12 and antenna 18 in the recess. Alternatively, the corrugated medium 26 may be selectively embossed so that the inlet 14 seats within the corrugated medium 26. The linerboards 22, 24 or corrugated medium 26 are preferably embossed so that the embossed region is not visible from the exterior of the corrugated structure 10. This is preferred in order to maintain the covert nature of the processor 12 and antenna 18 within the corrugated structure 10.

In the preferred embodiments, as shown in the figures, the RF processor is passive. However, a semi-passive or active system is also contemplated for use with the present design. If a semi-passive or active processor is utilized, a battery is coupled to the processor. In addition a sensor may be electrically coupled to the RF processor for communication with the processor 12, such as a MEMS (micro electromechanical system) sensor. The sensor may be used to read an environmental or other conditions in the vicinity of the sensor, such as time, temperature, pressure, and humidity, among other conditions. Multiple sensors may be utilized with a single or multiple RF processors. The sensors may be utilized to read and transmit a signal corresponding to the environmental or other conditions when signaled by an RF reader. Alternatively, the sensors may include a battery which allows the sensor to read and record the condition and the recorded data may be transmitted when activated by an RF reader. One type of passive sensor that may be utilized, for example, to read a temperature is manufactured by SCS of San Diego, Calif. A type of active sensor that may be utilized, for example, to record temperature data is manufactured by KSW of Germany. Other types of sensors may also be utilized.

A variety of commercially available processors are contemplated for use with the claimed invention, including both capacitive processors and inductive processors. Some commercially available processors include those manufactured by Phillips, Hitachi and Texas Instruments, among others.

Conductive leads, traces, or other conducting elements may be utilized, as discussed above, to establish an electrical connection between the processor terminals, and the antenna 18. These leads may be any type of conductive material known to those of skill in the art, such as conductive adhesive, a conductive polymer, or a solder. The leads may be preformed, or may be applied to the processor 12 and/or antenna 18 during the manufacturing process.

While corrugated structures 10, inlets 14, and labels 16 having certain layer thicknesses are shown in the figures, it should be noted that the various relative thicknesses are for illustration purposes only. The actual corrugated structure and RFID components may vary from the sizes and relative dimensions shown in the figures.

While various features of the claimed invention are presented above, it should be understood that the features may be used singly or in any combination thereof. Therefore, the claimed invention is not to be limited to only the specific embodiments depicted herein.

Further, it should be understood that variations and modifications may occur to those skilled in the art to which the claimed invention pertains. The embodiments described herein are exemplary of the claimed invention. The disclosure may enable those skilled in the art to make and use embodiments having alternative elements that likewise correspond to the elements of the invention recited in the claims. The intended scope of the invention may thus include other embodiments that do not differ or that insubstantially differ from the literal language of the claims. The scope of the present invention is accordingly defined as set forth in the appended claims.

What is claimed is:

1. A corrugated structure comprising:
a linerboard;
a corrugated medium coupled to the linerboard; and
an RF processor coupled between the linerboard and the corrugated medium.

2. The corrugated structure of claim 1, wherein the linerboard comprises a first and a second linerboard, and the corrugated medium is coupled between the first and second linerboard.

3. The corrugated structure of claim 2, wherein an adhesive is positioned between the first and second linerboards and the corrugated medium.

4. The corrugated structure of claim 2, wherein the RF processor is positioned between the second linerboard and the corrugated medium.

5. The corrugated structure of claim 1, wherein the RF processor is positioned on a label having an adhesive coupled to a side thereof, with the adhesive side of the label applied to the linerboard.

6. The corrugated structure of claim 5, wherein the corrugated medium comprises a plurality of flutes and an adhesive is positioned at the tips of the flutes.

7. The corrugated structure of claim 1, wherein the RF processor is positioned on an inlet having an adhesive coupled to a side thereof, with the adhesive of the inlet applied to the linerboard.

8. The corrugated structure of claim 7, wherein an adhesive is coupled to both sides of the inlet, with one side of the inlet adhered to the corrugated medium and the other side of the inlet adhered to the linerboard.

9. The corrugated structure of claim 2, further comprising a second corrugated medium and a third linerboard, with the second corrugated medium coupled between the first and third linerboards.

10. The corrugated structure of claim 9, wherein the RF processor is positioned between the second linerboard and the corrugated medium.

11. The corrugated structure of claim 1, wherein the corrugated medium comprises a plurality of flutes and the RF processor is a computer chip, with the computer chip positioned between two of the plurality of flutes of the corrugated medium.

12. The corrugated structure of claim 1, further comprising an antenna, wherein the antenna is onboard the RF processor.

13. The corrugated structure of claim 1, wherein the RF processor is positioned on an inlet and is electrically coupled to an antenna.

14. The corrugated structure of claim 13, wherein the inlet is coupled to a substrate that is one of the linerboard or the corrugated medium.

15. The corrugated structure of claim 14, wherein an adhesive layer is coupled to the inlet and the adhesive layer adheres the inlet to the substrate.

16. The corrugated structure of claim 14, wherein the antenna is one of an inductive antenna or a capacitive antenna, and the antenna is positioned on the substrate.

17. The corrugated structure of claim 16, wherein the antenna is a conductive ink that is positioned on the substrate and electrically coupled to the processor on the inlet.

18. The corrugated structure of claim 14, wherein the antenna is one of an inductive antenna or a capacitive antenna, and the antenna is positioned on the inlet.

19. The corrugated structure of claim 16, wherein the antenna is a conductive material that is printed, stamped, laminated, or sprayed on the substrate.

20. The corrugated structure of claim 13, wherein the inlet is coupled to a label having an adhesive layer, and the label is coupled to one of the linerboard or the corrugated medium by the adhesive layer.

21. The corrugated structure of claim 20, wherein the adhesive layer of the label is positioned on both sides of the label for adhering the label to both the linerboard and the corrugated medium.

22. The corrugated structure of claim 1, further comprising a sensor electrically coupled to the RF processor and positioned between the linerboard and the corrugated medium.

23. The corrugated structure of claim 22, wherein the sensor is an RF micro electromechanical system sensor.

24. The corrugated structure of claim 22, wherein the sensor is a temperature, pressure, or humidity sensor.

25. The corrugated structure of claim 1, further comprising at least one sheet of material fixed to the linerboard.

26. A method of forming a corrugated container with RFID components comprising;
    providing the corrugated structure of claim 1;
    cutting the corrugated structure into a blank;
    scoring the corrugated structure to produce fold lines; and
    assembling the blank into the shape of a container.

27. A method of forming a corrugated structure having an embedded RFID processor comprising:
    providing a linerboard;
    providing a corrugated medium;
    positioning an RF processor between the linerboard and the corrugated medium; and
    affixing the linerboard and the corrugated medium together with the RF processor positioned between the linerboard and the corrugated medium to form a corrugated structure.

28. The method of claim 27, further comprising positioning the RF processor on an inlet having an adhesive applied to one side thereof and the positioning step includes applying the adhesive side of the inlet to one of the linerboard or the corrugated medium.

29. The method of claim 28, further comprising adhering the inlet to a label having an adhesive applied to one side thereof, and the positioning step includes applying the adhesive side of the label and the adhesive side of the inlet to one of the linerboard or the corrugated medium.

30. The method of claim 27, wherein the RF processor comprises a computer chip and the corrugated medium includes a plurality of flutes, and the positioning step includes positioning the RF chip between two of the plurality of flutes.

31. The method of claim 27, wherein the linerboard comprises a first and a second linerboard, and the affixing step includes sandwiching the corrugated medium between the first and second linerboards.

32. The method of claim 31, wherein the positioning step includes positioning the RF processor between the second linerboard and the corrugated medium.

33. The method of claim 27, further comprising applying an adhesive to one of the linerboard or the corrugated medium.

34. The method of claim 27, further comprising cutting the corrugated structure with a cutter into a plurality of blanks.

35. The method of claim 34, further comprising registering the cutting step with the positioning step so that a single RF processor is coupled to each blank.

36. The method of claim 35, wherein the registering step includes reading the RF processor using an RFID reader to sense the position of the processor, and further comprising coordinating the sensed position of the processor with the cutter to cut each corrugated blank.

37. The method of claim 35, wherein the corrugated structure includes registration indicia which is readable by a registration device, and the registering step includes reading a position of the registration indicia, and correlating the reading of the registration indicia with the positioning of the RF processor and the cutting of the corrugated structure.

38. The method of claim 37, wherein the processor has an onboard antenna and further comprising coupling the processor to an inlet and the positioning step includes positioning the inlet between the linerboard and the corrugated medium.

39. The method of claim 38, further comprising coupling the inlet to a label, wherein the positioning step includes positioning the label between the linerboard and the corrugated medium.

40. The method of claim 27, further comprising:
    providing an inlet; and
    attaching the RF processor to the inlet, wherein the positioning step comprises positioning the inlet with the RF processor between the linerboard and the corrugated medium.

41. The method of claim 27, further comprising coupling an antenna to the RF processor.

42. The method of claim 41, wherein the coupling step comprises positioning the antenna on one of the linerboard or the corrugated medium and electrically associating the RF processor with the antenna.

43. The method of claim 41, wherein the coupling step comprises printing the antenna on one of the linerboard or the corrugated medium with a conductive ink and electrically associating the RF processor with the antenna.

44. The method of claim 42, further comprising positioning the processor on an inlet and positioning the inlet over the antenna.

45. The method of claim 41, further comprising:
    coupling the processor and the antenna to an inlet and positioning the inlet between the linerboard and corrugated medium.

46. The method of claim 45, further comprising coupling the inlet to a label, wherein the label is positioned between the linerboard and the corrugated medium.

47. The method of claim 27, further comprising electrically coupling a sensor to the RF processor between the linerboard and the corrugated medium.

48. An assembly line for forming a corrugated structure comprising:

a supply of a first linerboard;

a supply of a second linerboard;

a supply of a corrugating material stock;

a supply of inlets comprising an RF processor and an antenna coupled to the processor;

a corrugator for corrugating the corrugating material stock into a corrugated medium;

a single facer for joining the first linerboard to the corrugated medium;

a double facer for joining the second linerboard to the corrugated medium on a side of the corrugated medium opposite the first linerboard to form a corrugated structure, said double facer positioned downstream from the single facer;

an inlet applicator for coupling the supply of inlets to one of the first linerboard or the second linerboard, said inlet applicator positioned upstream of the double facer; and a cutter for cutting the corrugated structure into blanks.

49. The assembly line of claim 48, further comprising a registration mechanism for registering the cutter and inlet applicator so that a single RF inlet is positioned on each blank.

50. The assembly line of claim 48, further comprising a preheater positioned downstream from the double facer for heating the second linerboard;

an adhesive applicator positioned adjacent the single facer for adhering the first linerboard to the corrugated medium;

an adhesive applicator positioned adjacent the double facer for adhering the second linerboard to the corrugated medium; and a drying device for drying the corrugated structure.

51. The assembly line of claim 50, wherein the inlet applicator is positioned downstream from the preheater, but upstream of the double facer.

52. The assembly line of claim 48, wherein the inlet applicator is positioned upstream of the corrugator and further comprising a registration mechanism for registering the inlet applicator to apply inlets so that the processor is positioned between the flutes of the corrugated medium.

53. The assembly line of claim 48, wherein the supply of inlets comprise a roll of inlets having a pressure sensitive adhesive, and the inlet applicator applies the inlets to the first linerboard, with the pressure sensitive adhesive adhering the inlet to the first linerboard.

54. The assembly line of claim 53, further comprising a preheater positioned downstream from the double facer for heating the second linerboard;

an adhesive applicator positioned adjacent the single facer for applying adhesive to the corrugated medium for adhering the first linerboard to the corrugated medium; and a drying device for drying the corrugated structure.

55. The assembly line of claim 54, wherein the inlet applicator is positioned upstream of the preheater.

56. An assembly line for forming a corrugated structure comprising:

a supply of a first linerboard;

a supply of a second linerboard having positioned thereon an antenna in a regular pattern;

a supply of a corrugating material stock;

a supply of inlets comprising an RF processor;

a corrugator for corrugating the corrugating material stock into a corrugated medium, said corrugator positioned downstream from the supply of corrugating material stock;

a single facer for joining the first linerboard to the corrugated medium;

a double facer for joining the second linerboard to the corrugated medium on a side of the corrugated medium opposite the first linerboard to form a corrugated structure;

an inlet applicator for positioning the inlet on the second linerboard in electrical communication with the antenna, said inlet applicator positioned upstream of the double facer; and a cutter for cutting the corrugated structure into blanks.

57. The assembly line of claim 54, wherein the antenna is a capacitive antenna that comprises two conductive areas on the second liner board, with a gap positioned between the two conductive areas, and the inlet applicator positions the supply of inlets such that the RF processor of each inlet is positioned at least partially within the gap.

58. The assembly line of claim 56, wherein the antenna is an inductive loop that comprises two poles, and the inlet applicator positions the supply of inlets such that the RF processor on each inlet is in electrical communication with the poles of the inductive loop.

* * * * *